United States Patent
Shin et al.

(10) Patent No.: US 7,295,050 B2
(45) Date of Patent: Nov. 13, 2007

(54) POWER-UP RESET CIRCUIT WITH REDUCED POWER CONSUMPTION

(75) Inventors: Chang-Ho Shin, Suwon-si (KR); Nam-Jong Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 14 days.

(21) Appl. No.: 11/117,400

(22) Filed: Apr. 29, 2005

(65) Prior Publication Data

US 2005/0280450 A1    Dec. 22, 2005

(30) Foreign Application Priority Data

Jun. 18, 2004   (KR) ...................... 10-2004-0045688

(51) Int. Cl.
*H03L 7/00* (2006.01)
(52) U.S. Cl. ...................................... 327/143; 327/198
(58) Field of Classification Search ................ 327/142, 327/143, 198
See application file for complete search history.

(56) References Cited

U.S. PATENT DOCUMENTS

| | | | | |
|---|---|---|---|---|
| 4,210,829 A | * | 7/1980 | Wong et al. | ................. 327/546 |
| 5,523,709 A | * | 6/1996 | Phillips et al. | ............... 327/143 |
| 6,147,521 A | * | 11/2000 | Degoirat et al. | ............... 327/81 |
| 6,683,481 B1 | * | 1/2004 | Zhou et al. | ................. 327/143 |
| 7,030,668 B1 | * | 4/2006 | Edwards | ...................... 327/143 |
| 7,161,396 B1 | * | 1/2007 | Zhou et al. | ................. 327/143 |

FOREIGN PATENT DOCUMENTS

| | | | |
|---|---|---|---|
| JP | 58079333 A | * | 5/1983 |
| JP | 2003-347911 | | 12/2003 |
| KR | 1997-0019050 | | 4/1997 |
| KR | 1020030085163 A | | 11/2003 |

* cited by examiner

*Primary Examiner*—Kenneth B. Wells
*Assistant Examiner*—William Hernandez
(74) *Attorney, Agent, or Firm*—Harness, Dickey & Pierce, P.L.C.

(57) ABSTRACT

A power-up reset circuit with reduced power consumption. The resistance of the power-up reset circuit may be adjusted during a power-up operation. The standby current may thereby be reduced, which may reduce the power consumption in the power-up reset circuit.

26 Claims, 8 Drawing Sheets

POWER-UP RESET CIRCUIT WITH REDUCED POWER CONSUMPTION

CROSS-REFERENCE TO RELATED APPLICATION

This application claims the benefit of Korean Patent Application No. 2004-45688, filed Jun. 18, 2004, the disclosure of which is hereby incorporated herein by reference in its entirety.

BACKGROUND OF THE INVENTION

1. Field of the Invention

The present invention relates generally to a power-up reset circuit, and more particularly, to a power-up reset circuit for reducing power consumption.

2. Description of the Related Art

A power-up operation may include a power voltage applied to a semiconductor memory device. While the semiconductor memory device undergoes the power-up operation, the power voltage may not be completely stable. The instability of the power voltage may make it difficult to interpret voltage levels (e.g., high and/or low voltage levels) within the semiconductor memory device. When the power voltage is first applied during power-up, the semiconductor memory device may require initialization. Thus, conventional semiconductor memory devices may include a power-up reset circuit which may prevent the semiconductor memory device from operating and may initialize the semiconductor memory device during the power-up operation.

FIG. 1 illustrates a block diagram of a conventional power-up reset circuit 100. Referring to FIG. 1, the power-up reset circuit 100 may include a power voltage detecting portion 10 and a signal generating portion 20. The power voltage detecting portion 10 may include a detecting portion 12 and an output portion 14. The detecting portion 12 may include resistors R1 and R2. The output portion 14 may include a resistor R3 and an NMOS transistor N1. The signal generating portion 20 may include inverters IV1, IV2 and IV3.

The power voltage detecting portion 10 may detect a voltage level (e.g., a high voltage level, a low voltage level, etc.) of a power voltage Vcc applied from an external portion (not shown) to output a voltage detecting signal VD. The detecting portion 12 may output a node voltage VA in response to the power voltage Vcc. During a power-up operation, the power voltage Vcc may gradually increase. The node voltage VA at a node A of the detecting portion 12 may increase with the power voltage Vcc. The voltage levels of the node voltage VA and the power voltage VA may be based on the power voltage Vcc and the resistances of resistors R1 and R2. The detecting portion 12 may output the node voltage VA.

The output portion 14 may output the power detecting signal VD in response to the node voltage VA received from the detecting portion 12. If the node voltage VA is lower than a threshold voltage level, the NMOS transistor N1 may be turned off. The voltage detecting signal VD may be set to a first voltage level (e.g., a high voltage level) in response to the NMOS transistor N1 turning off. Alternatively, if the node voltage VA is higher than the threshold voltage level, the NMOS transistor N1 may be turned on. The voltage detecting signal VD may be set to a second voltage level (e.g., a low voltage level) in response to the NMOS transistor N1 turning on.

The signal generating portion 20 may invert the voltage detecting signal VD. The inverted signal may be delayed by a given amount of time (e.g., due to the inverting operation). The inverted signal may be output as a reset signal VCCH at a given voltage level (e.g., a high voltage level or the power voltage Vcc level, a low voltage level or ground, etc.).

The power-up reset circuit 100 may output the reset signal VCCH at the second voltage level (e.g., the low voltage level) if the power voltage Vcc is lower than a threshold voltage level. Alternatively, the power-up reset circuit 100 may output the reset signal VCCH at the first voltage level (e.g., a high voltage level or the power voltage Vcc) if the power voltage Vcc is higher than the threshold voltage level.

The power-up reset circuit 100 may have increased power consumption due to a standby current flowing through the power voltage detecting portion 10 during a normal operation. In other words, since the standby current may flow through the detecting portion 12 and the NMOS transistor N1 may be turned on during a normal operation, the standby current may flow through the output portion 14.

Further, when a power dip (i.e., a temporarily reduced power voltage Vcc) occurs during a normal operation, an abnormal (e.g., unstable) operation of the conventional semiconductor memory device may occur (e.g., since the reset signal VCCH may transition to the second voltage level).

FIG. 2 is a graph illustrating the reset signal VCCH and the power voltage Vcc of the power-up reset circuit 100 of FIG. 1 during operation. In FIG. 2, a dotted line may denote the power voltage Vcc and a solid line combined with the dotted line may denote the reset signal VCCH.

Referring to FIG. 2, during the power-up operation, the power voltage Vcc increases (e.g., before t1). The power voltage Vcc may reach a threshold voltage level V1 at t1. When the power voltage Vcc reaches the threshold voltage level V1 at t1, a reset signal VCCH may transition from the second voltage level (e.g., a low voltage level) to the first voltage level (e.g., a high voltage level or the power voltage level Vcc). When the reset signal VCCH transitions to the first voltage level, a conventional semiconductor memory device including the power-up reset circuit 100 may begin normal operation.

However, if a power dip occurs during the normal operation, the conventional semiconductor memory device may discontinue normal operation (e.g., because the conventional semiconductor memory device believes that the power voltage Vcc has been shut off). Referring to FIG. 2, a power dip is illustrated between t2 and t3. Thus, the power voltage Vcc drops below the threshold voltage level V1 (at t2) and the reset signal VCCH transitions from the first voltage level to the second voltage level. The power voltage Vcc may rise above the threshold voltage level V1 (at t3). As shown, the reset signal VCCH may transition from the second voltage level back to the first voltage level (at t3). Thus, a power dip may interrupt normal operation in conventional semiconductor memory devices.

FIG. 3 illustrates a block diagram of another conventional power-up reset circuit 300. As described above with respect to the power-up reset circuit 100 of FIG. 1, the power-up reset circuit 300 of FIG. 3 may include the power voltage detecting portion 10. The power-up reset circuit 300 may further include a signal generating portion 22, a switch portion 30, a cut off portion 40, and a latch portion 50.

The power voltage detecting portion 10 of FIG. 3 is described above with respect to FIG. 1 and will not be described further. The signal generating portion 22 may include inverters IV1 and IV2. The switch portion 30 may include a PMOS transistor P1. The cut off portion 40 may include an inverter IV4, PMOS transistors P2 and P3, and NMOS transistors N2 and N3. The latch portion 50 may include an inverter IV5 and an NMOS transistor N4.

The PMOS transistor P1 may include a gate where the reset signal VCCH may be received (e.g., the reset signal VCCH output from the power-up reset circuit 300 may be fed back to the PMOS transistor P1). The PMOS transistor P1 may be set (e.g., turned on or off) in response to the reset signal VCCH to control operation of the power voltage detecting portion 10. If the reset signal VCCH is at the second voltage level, the PMOS transistor P1 may be turned on, and the power voltage detecting portion 10 may begin operation.

If the power voltage Vcc increases above the threshold voltage level, the reset signal VCCH may transition to the first voltage level, the PMOS transistor P1 may be turned off, and the NMOS transistor N1 of the power voltage detecting portion 10 may be turned off. As a result, the power voltage detecting portion 10 may not operate, and a standby current which may flow through the detecting portion 12 and the output portion 14 may be reduced.

The cut off portion 40 may be isolate from the latch portion 50 and/or the signal generating portion 22 may be isolated from the power voltage detecting portion 10 in response to the reset signal VCCH. If the reset signal VCCH is at the second voltage level, the PMOS transistors P3 and the NMOS transistor N3 may be turned on, and a voltage detecting signal VD may be output from the power voltage detecting portion 10. The voltage detecting signal VD may be received by the latch portion 50. Alternatively, if the reset signal VCCH is at the first voltage level, the PMOS transistors P3 and the NMOS transistor N3 may be turned off, and the power voltage detecting portion 10 may be isolated from the latch portion 50.

An example where the latch portion 50 may prevent the reset signal VCCH from transitioning to the second voltage level during normal operation will now be described. Referring to FIG. 3, if the voltage detecting signal VD received from the cut off portion 40 is at the first voltage level, the inverter IV5 may output a latch signal VL at the second voltage level. If the power voltage Vcc increases (e.g., above the threshold voltage level), the voltage detecting signal VD may transition to the first voltage level, the inverter IV5 may output the latch signal VL at the first voltage level and the NMOS transistor N4 may be turned on. In response to the NMOS transistor N4 turning on, an input end of the inverter IV5 may be set to the second voltage level, thereby preventing an output of the inverter IV5 from transitioning to the second voltage level. Thus, the reset signal VCCH may not transition to the second voltage level in the above-described example.

The signal generating portion 22 may delay the latch signal VL. The delayed signal may be output as the reset signal VCCH at a given voltage level (e.g., a high voltage level or the power voltage Vcc level, a low voltage level or ground, etc.).

Referring to FIG. 3, the operation of the power-up reset circuit 300 may not be interrupted if the power voltage Vcc drops below the threshold voltage level. If the power voltage Vcc increases above the threshold voltage level, the reset signal VCCH may be set to the power voltage Vcc level. The switch portion 30 may be turned off to stop an operation of the power voltage detecting portion 10, thereby reducing the standby current. Further, the cut off portion 40 may isolate the power voltage detecting portion 10 from the latch portion 50 and the signal generating portion 22. The latch portion 50 may prevent the reset signal VCCH from transitioning to the second voltage level again during a normal operation. Thus, after the reset signal VCCH is set to the first voltage level, the reset signal VCCH may remain at the first voltage level (e.g., the power voltage Vcc).

FIG. 4 is a graph illustrating the reset signal VCCH and the power voltage Vcc of the power-up reset circuit 300 of FIG. 3. In FIG. 4, a dotted line may denote the power voltage Vcc and a solid line combined with the dotted line may denote the reset signal VCCH.

Referring to FIG. 4, the power voltage Vcc may increase above the threshold voltage level V1 (at t1). The reset signal VCCH may transition from the second voltage level to the first voltage level (at t1) (e.g., the power voltage level Vcc). The reset signal VCCH may be fixed to the power voltage Vcc level (at t1) (e.g., by the latch portion 50) such that the reset signal VCCH may not transition to the second voltage level when a power dip occurs (between t2 and t3).

However, incorrect information (e.g., from a previous operation) may be stored in the power-up reset circuit 300 during the power-up operation due to characteristics of the latch portion 50. The latch signal VL may be stored at the first voltage level at the beginning of the power-up operation. This may cause the reset signal VCCH to be output at the first voltage level. Thus, the power-up reset circuit may not operate during the power-up operation, and the reset signal VCCH may not be generated correctly. An additional reset circuit may be required to cause the reset signal VCCH to be output at the second voltage level during a power reset.

SUMMARY OF THE INVENTION

An example embodiment of the present invention is directed to a power-up reset circuit, including a first resistance adjuster including a first resistor and a first transistor, the first transistor in parallel with the first resistor and receiving a feedback voltage, the first transistor adjusting a resistance of the first resistor based on the received feedback voltage, the adjusted resistance creating a divergence between a first threshold voltage and a second threshold voltage.

BRIEF DESCRIPTION OF THE DRAWINGS

The present invention will become more apparent by describing in detail example embodiments thereof with reference to the attached drawings in which.

DETAILED DESCRIPTION OF THE EXAMPLE EMBODIMENTS OF THE PRESENT INVENTION

Figure 1:
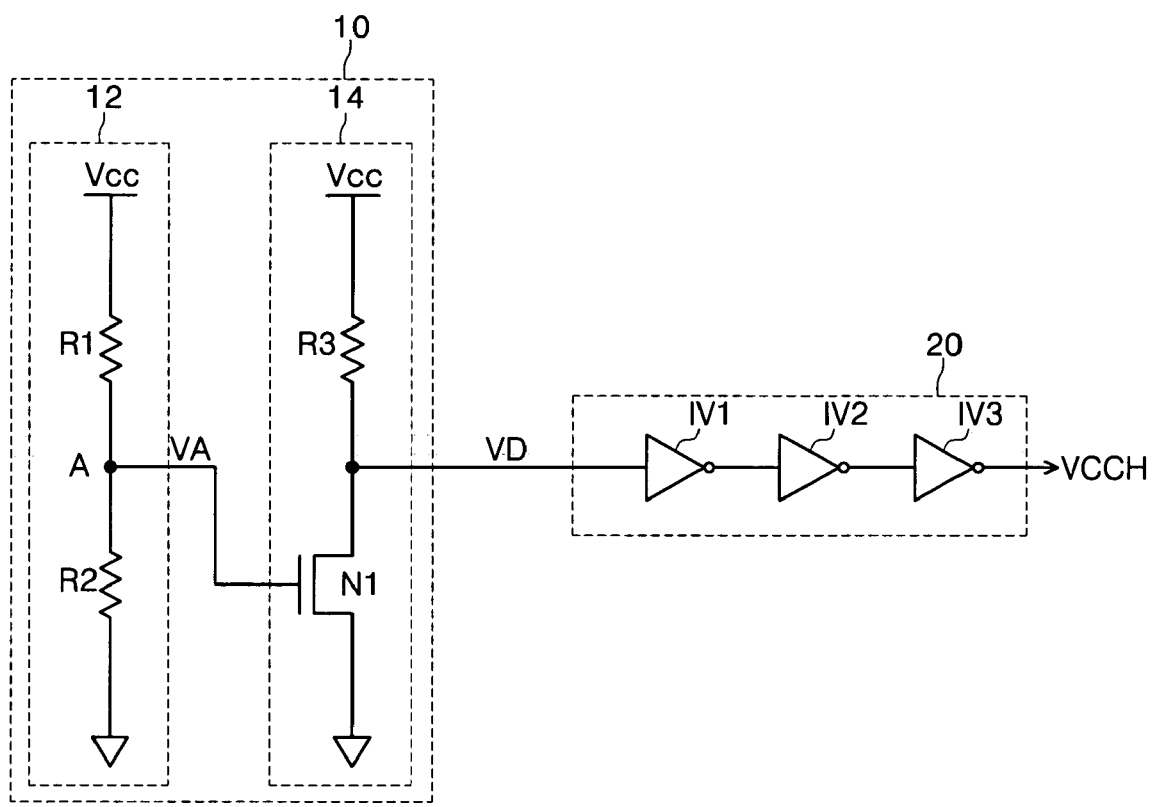
FIG. 1 illustrates a block diagram of a conventional power-up reset circuit.
Figure 2:
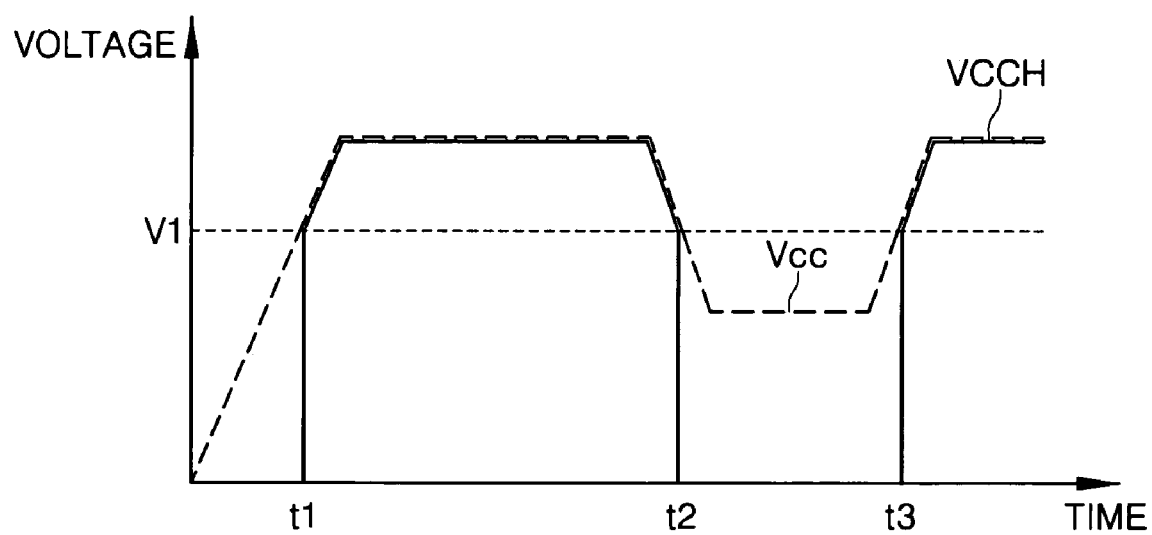
FIG. 2 is a graph illustrating the reset signal VCCH and the power voltage Vcc of the power-up reset circuit of FIG. 1.

Hereinafter, example embodiments of the present invention will be described in detail with reference to the accompanying drawings.

In the Figures, the same reference numerals are used to denote the same elements throughout the drawings.

Figure 5:
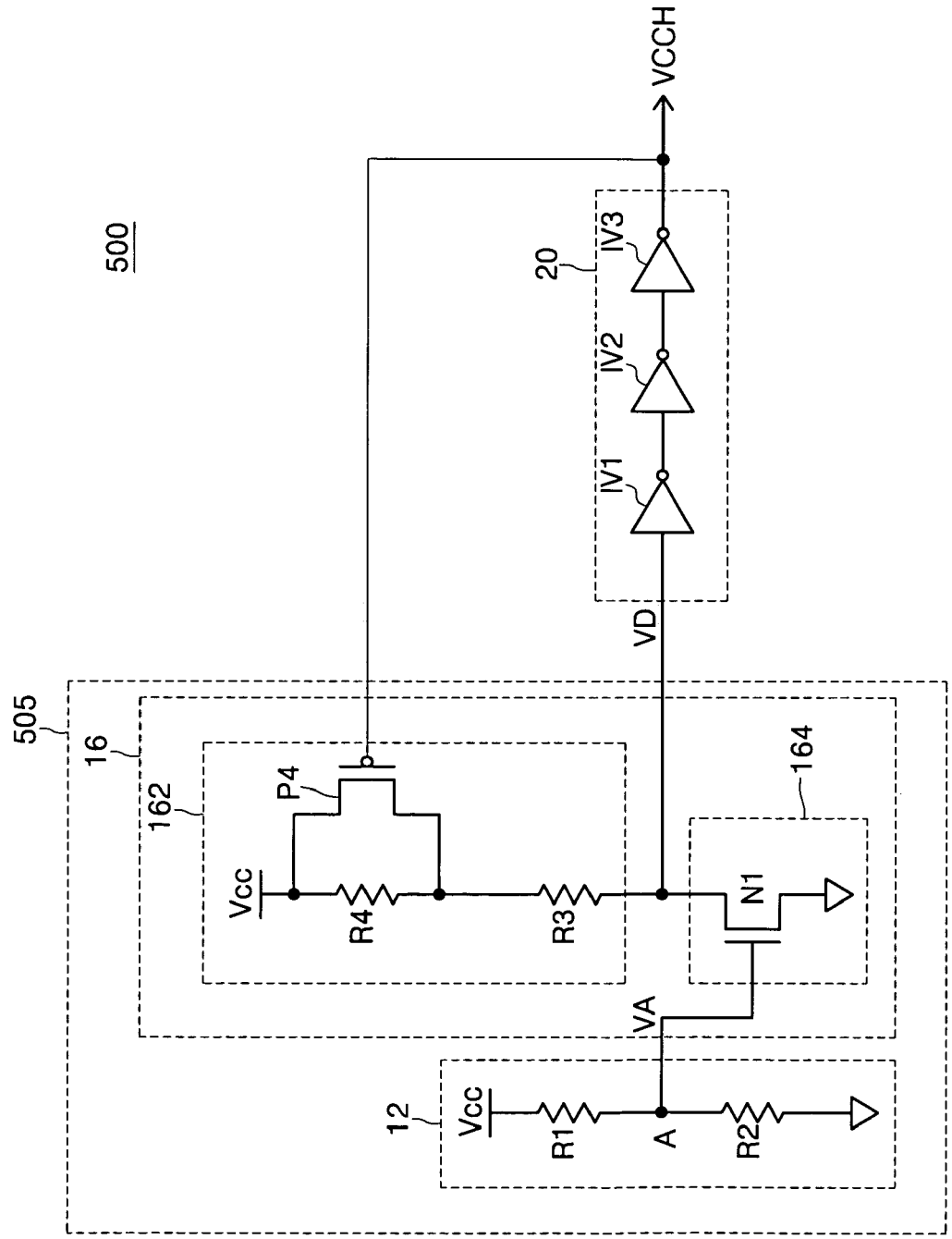
FIG. 5 is a block diagram illustrating a power-up reset circuit according to an example embodiment of the present invention.

FIG. 5 is a block diagram illustrating a power-up reset circuit 500 according to an example embodiment of the present invention. The power-up reset circuit 500 may include a power voltage detecting portion 505 and a signal generating portion 20. The power voltage detecting portion 505 may include a detecting portion 12 and an output portion 16. The output portion 16 may include a pull-up 162 and a pull-down 164. The pull-up 162 may include resistors R3 and R4 and a PMOS transistor P4. The pull-down 164 may include an NMOS transistor N1.

In one example embodiment of the present invention, the power voltage detecting portion 505 may detect a power voltage Vcc and may output a voltage detecting signal VD.

Figure 3:
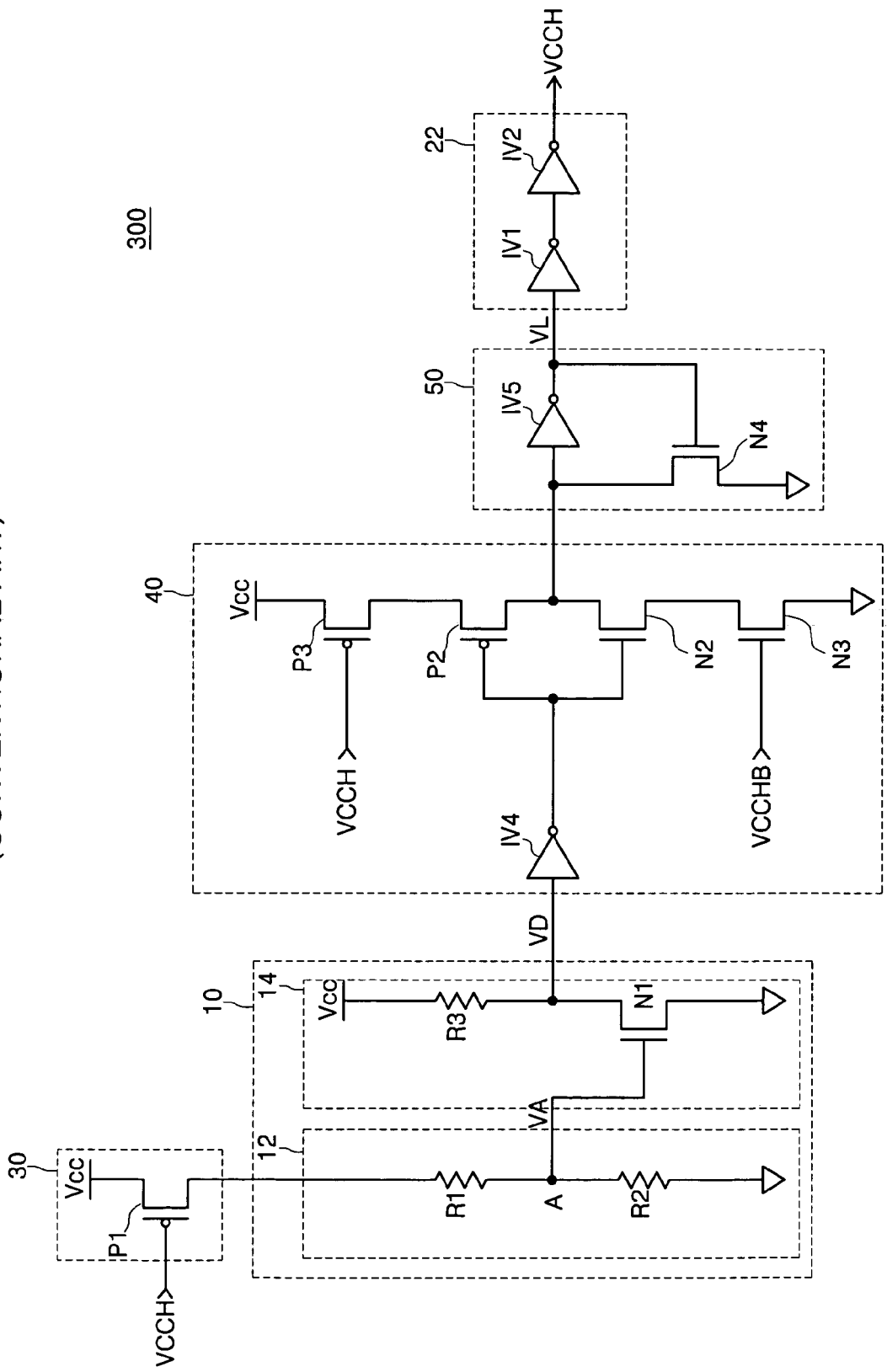
FIG. 3 illustrates a block diagram of another conventional power-up reset circuit.
Figure 4:
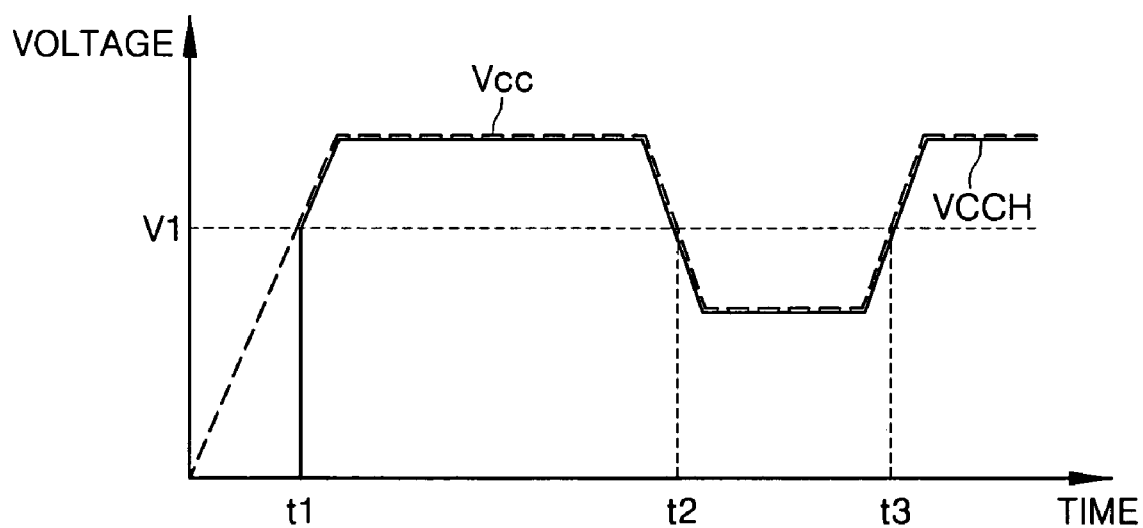
FIG. 4 is a graph illustrating the reset signal VCCH and the power voltage Vcc of the power-up reset circuit of FIG. 3.

In one example embodiment of the present invention, the detecting portion 12 of FIG. 5 may function as above-described with respect to FIGS. 1 and 3. Thus, the detecting portion 12 may output a node voltage VA in response to the power voltage Vcc. The node voltage VA at a node A of the detecting portion 12 may change with the power voltage Vcc. The voltage level of the node voltage VA and the power voltage VA may be based on the power voltage Vcc and the resistances of resistors R1 and R2. The detecting portion 12 may output the node voltage VA.

In one example embodiment of the present invention, the pull-up 162 may include a resistance which may vary in response to a reset signal VCCH.

In one example embodiment of the present invention, the NMOS transistor N1 may operate in response to the node voltage VA. Operation of the NMOS transistor N1 may be controlled based on a resistance of the pull-up 162 to output a voltage detecting signal VD. The reset signal VCCH may be set at a second voltage level (e.g., a low voltage level or ground) during a power-up operation. The PMOS transistor P4 may be turned on such that the resistance of the pull-up 162 may be determined by the resistor R3 (e.g., since the resistor R4 may be bypassed due to a short induced by the PMOS transistor P4). The reset signal VCCH may be set to a first voltage level (e.g., a high voltage level or the power voltage Vcc) during normal operation. Thus, the PMOS transistor P4 may be turned off such that the resistance of the pull-up 162 may be the sum of the resistors R3 and R4 (e.g., since the PMOS transistor P4 may be turned off and thereby set to a higher resistance).

In one example embodiment of the present invention, the signal generating portion 20 may function as described above with respect to FIG. 1. Thus, the signal generating portion 20 may invert the voltage detecting signal VD. The inverted signal may be delayed by a given amount of time (e.g., due to the inverting operation). The inverted signal may be output as the reset signal VCCH at a given voltage level (e.g., a high voltage level or the power voltage Vcc level, a low voltage level or ground, etc.).

In one example embodiment of the present invention, a resistance of the pull-up 162 during normal operation may be higher as compared to during a power-up operation. Thus, a standby current flowing through the output portion 16 during a normal operation may be reduced. Further, in order to turn off the NMOS transistor N1, a lower voltage level as compared to the power voltage Vcc may be required such that the NMOS transistor N1 may be turned on during a power-up operation. The difference between the lower voltage level and the power voltage Vcc may be referred to as a voltage margin.

In one example embodiment of the present invention, the power-up reset circuit 500 may turn on the PMOS transistor P4 in order to reduce a resistance of the pull-up 162 during a power-up operation. Alternatively, in one example embodiment of the present invention, the PMOS transistor P4 may be turned off in order to increase a resistance of the pull-up 162 (e.g., when the power voltage Vcc increases above a threshold voltage level and/or the reset signal VCCH may be set to the first voltage level).

Thus, even though the NMOS transistor N1 may remain turned on during normal operation, the standby current through the output portion 16 may be reduced, thereby reducing power consumption. Further, while a power dip may occur during the normal operation, a first transition threshold voltage level (e.g., a voltage level of the power voltage Vcc at which the reset signal VCCH transitions from the second voltage level to the first voltage level) may be lower (e.g., by the voltage margin) as compared to a second transition threshold voltage level (e.g., a voltage level of the power voltage Vcc at which the reset signal VCCH transitions from the first voltage level to the second voltage level)

Figure 6:
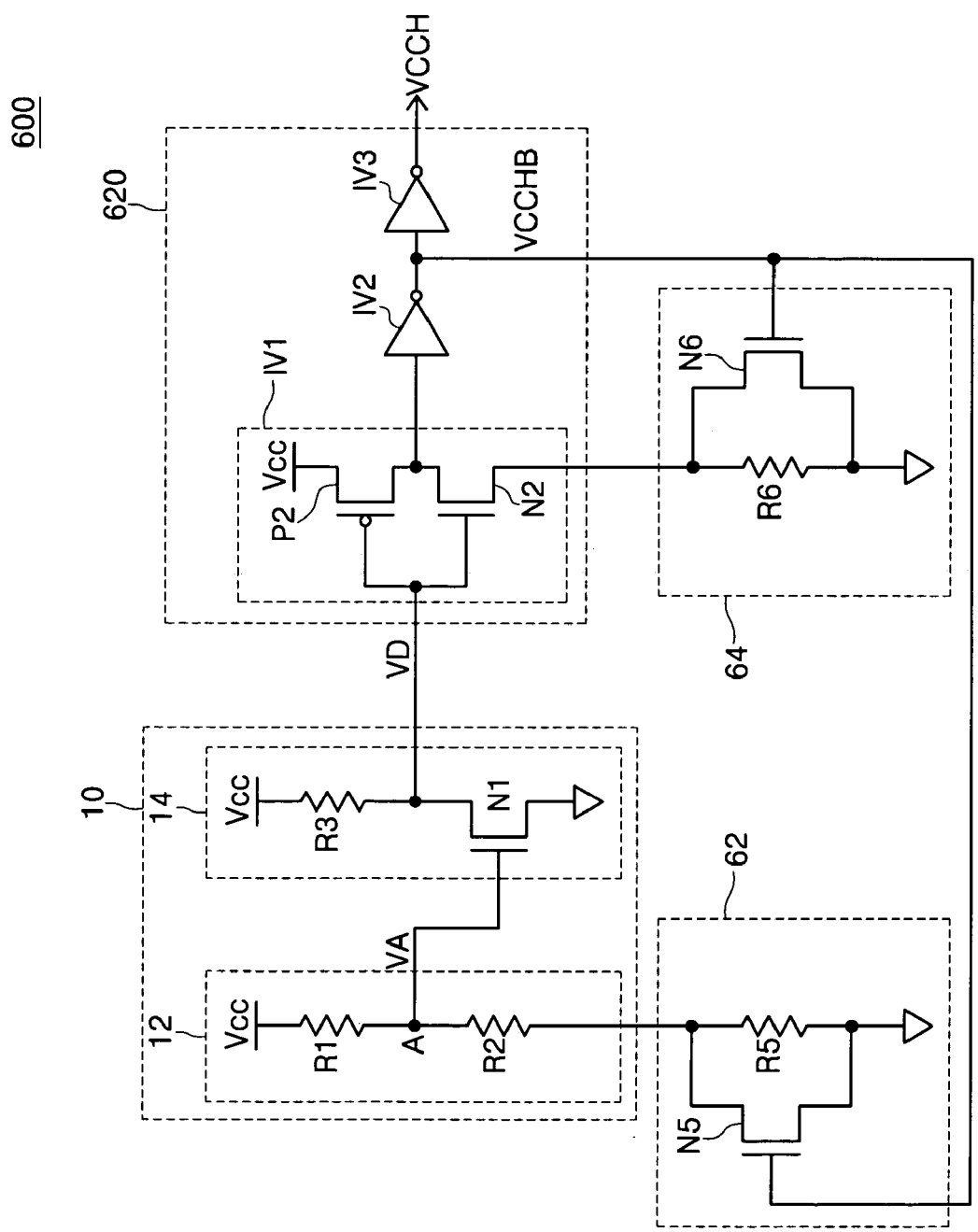
FIG. 6 is a block diagram illustrating another power-up reset circuit according to another example embodiment of the present invention.

FIG. 6 is a block diagram illustrating a power-up reset circuit 600 according to another example embodiment of the present invention. The power-up reset circuit 600 may include a power voltage detecting portion 10, a signal generating portion 620, and first and second resistance controllers 62 and 64, respectively. The power voltage detecting portion 10 may include a detecting portion 12 and an output portion 14. The first resistance controller 62 may include a resistor R5 and an NMOS transistor N5 which may be connected to the resistor R5 in parallel, and the second resistance controller 64 may include a resistor R6 and an NMOS transistor N6 which may be connected to the resistor R6 in parallel.

In another example embodiment of the present invention, the power voltage detecting portion 10 may function as described above with respect to FIGS. 1 and 3.

In another example embodiment of the present invention, the first and second resistance controllers 62 and 64 may control (e.g., vary) a resistance in response to an inverted reset signal VCCHB. The inverted reset signal VCCHB may include an inverted voltage level as compared to the reset signal VCCH.

In another example embodiment of the present invention, if the inverted reset signal VCCHB is at the first voltage level, the NMOS transistors N5 and N6 may be turned on such that the resistors R5 and R6 may not affect the power-up reset circuit 600 (e.g., since the resistors R5 and R6 may be bypassed due to a short induced by the NMOS transistors N5 and N6, respectively).

Alternatively, if the inverted reset signal VCCHB is at the second voltage level, the NMOS transistors N5 and N6 may be turned off such that a resistance value of the power-up reset circuit 600 may be increased by the resistors R5 and R6 (e.g., since the resistors R5 and R6 may not be bypassed by the NMOS transistors N5 and N6, respectively).

In another example embodiment of the present invention, the standby current flowing through the detecting portion 12 and/or the signal generating portion 620 may be reduced which may thereby reduce power consumption in the power-up reset circuit 600. Further, if a resistance (e.g., resistor R5) is increased by the first resistance controller 62, the node voltage VA output from the detecting portion 12 may be increased even though the power voltage Vcc may not be changed. Thus, the power voltage Vcc required (e.g., the second transition threshold voltage level) to turn off the NMOS transistor N1 may be lower as compared to a required voltage level (e.g., the first transition threshold voltage level) for turning on the NMOS transistor N1 during a power-up operation. Thus, the voltage margin is increased.

Figure 7:
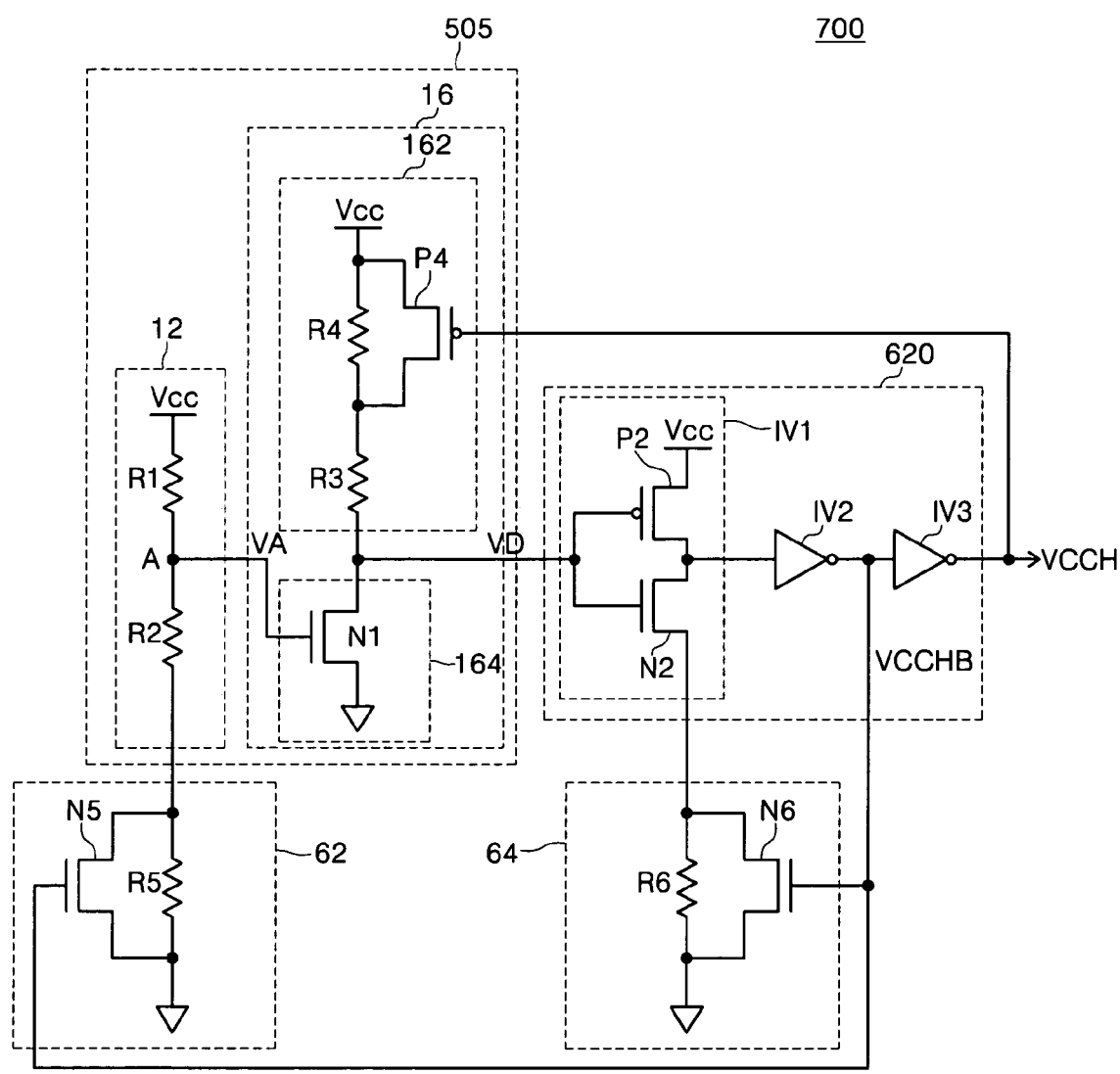
FIG. 7 is a block diagram illustrating another power-up reset circuit according to another example embodiment of the present invention.

FIG. 7 is a block diagram illustrating a power-up reset circuit 700 according to another example embodiment of the present invention. The power-up reset circuit 700 may include a power voltage detecting portion 505, a signal generating portion 620, and first and second resistance controllers 62 and 64. The power voltage detecting portion 505 may include a detecting portion 12 and an output portion 16. The output portion 16 may include a pull-up 162 and a pull-down 164.

In another example embodiment of the present invention, the pull-down 164 may include NMOS transistor N1.

In another example embodiment of the present invention, the signal generating portion 620 and the first and second resistance controllers 62 and 64 may function as described above with respect to FIG. 6.

In another example embodiment of the present invention, the power voltage detecting portion 505 and the output portion 16 may function as described above with respect to FIG. 5.

In another example embodiment of the present invention, the detecting portion 12 may function as described above with respect to FIGS. 1, 3, 5 and/or 6.

In another example embodiment of the present invention, the power-up reset circuit 700 may reduce the standby current flowing through the detecting portion 12, the output portion 16 and/or the signal generating portion 620 (e.g., since resistances of the pull-up 162 and/or the first and second resistance controllers 62 and 64 may be higher during normal operation if a reset signal VCCH is at the first voltage level).

In another example embodiment of the present invention, since resistances of the pull-up 162 and/or the first resistance controller 62 may be higher during a normal operation as compared to during a power-up operation, a voltage level of the power voltage Vcc required (e.g., the second transition threshold voltage level) to cause the reset signal VCCH to transition from the first voltage level to the second voltage level (e.g., a voltage level of the power voltage Vcc that may turn off the NMOS transistor N1) may be lowered. Thus, the reset signal VCCH may be maintained at the first voltage level during a power dip, thereby preventing or reducing an abnormal operation of a device (e.g., a semiconductor memory device) including the power-up reset circuit 700.

Figure 8:
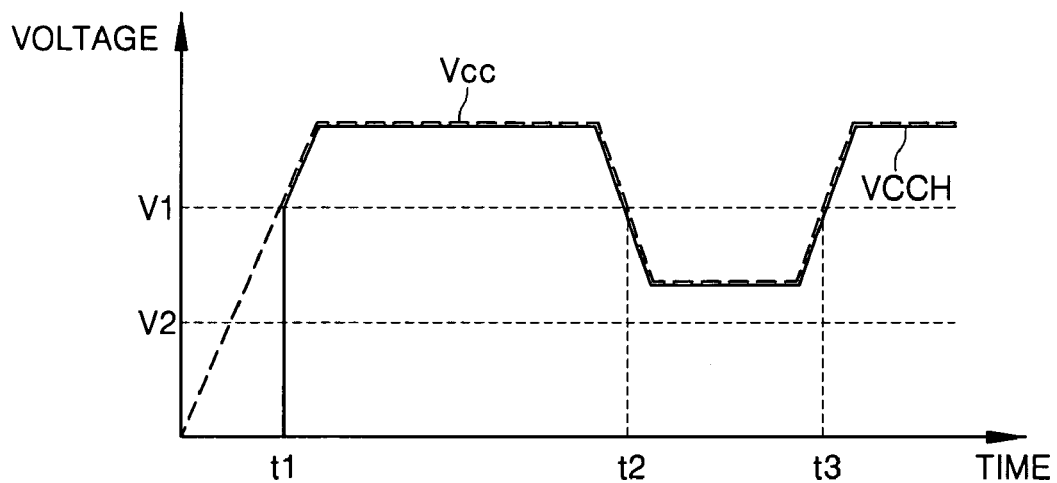
FIG. 8 is a graph illustrating the reset signal VCCH and the power voltage Vcc of a power-up reset circuit according to another example embodiment of the present invention.

FIG. 8 is a graph illustrating the reset signal VCCH and the power voltage Vcc of a power-up reset circuit (e.g., any of power-up reset circuits 500, 600 and 700) according to another example embodiment of the present invention. In FIG. 8, a dotted line may denote the power voltage Vcc and a solid line combined with the dotted line may denote the reset signal VCCH.

In another example embodiment of the present invention, referring to FIG. 8, a power voltage Vcc may rise above a first threshold voltage level V1 (e.g., the first transition threshold voltage level) (at t1) and a reset signal VCCH may transition from the second voltage level to the first voltage level (e.g., a high voltage level or the power voltage level Vcc). During normal operation (e.g., after t1), a power dip may occur (between t2 and t3) (e.g., the power voltage Vcc may temporarily fall below the first threshold voltage V1). However, while the power voltage Vcc may be lower than the first threshold voltage level V1, the power voltage Vcc may remain higher than a second threshold voltage level V2 (e.g., the second transition threshold voltage level) (between t2 and t3). Thus, the reset signal VCCH may be maintained at the first voltage level. As discussed above, the voltage margin may be the difference between the first and second threshold voltages V1 and V2.

Figure 9:
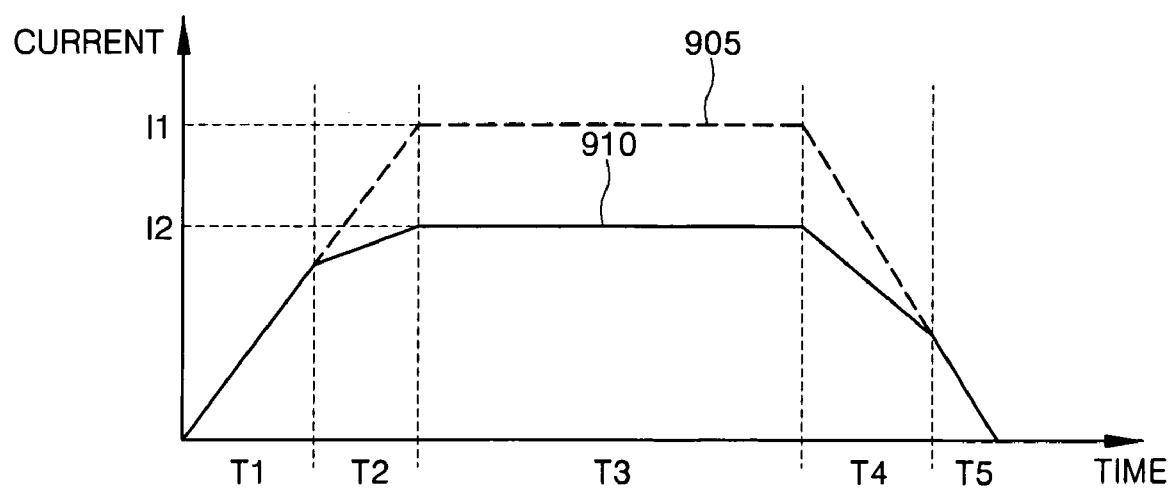
FIG. 9 is a graph illustrating a comparison of the standby current of the conventional power-up reset circuit of FIG. 1 as compared to the standby current of a power-up reset circuit according to another example embodiment of the present invention.

FIG. 9 is a graph illustrating a comparison of the standby current of the power-up reset circuit 100 of FIG. 1 as compared to the standby current of a power-up reset circuit (e.g., any one of power-up reset circuits 500, 600 and 700) according to an example embodiment of the present invention. In FIG. 9, a dotted line 905 may denote the standby current of the power-up reset circuit 100 of FIG. 1, and a solid line 905 may denote the standby current of a power-up reset circuit according to an example embodiment of the present invention.

In another example embodiment of the present invention, referring to FIG. 9, the standby current during operation of the power-up reset circuit 100 is given as the dotted line. Thus, as shown in FIG. 9, since the power-up reset circuit 100 may include a resistance value during a normal operation which may be identical to a resistance value during a power-up operation, the dotted line 905 indicating the standby current may increase at a higher rate and to a higher level as compared to the solid line 910. Referring to the dotted line 905, as the power voltage Vcc rises past the first threshold voltage V1 (after T1), the standby current increases at the same rate (during T2). The power voltage Vcc may be maintained at a given level (e.g., throughout T1, T2 and T3) and the standby current may be constant at a current level I1 (during T3). The power voltage Vcc may fall, thereby causing the standby current to fall (during T4 and T5).

In another example embodiment of the present invention, referring to FIG. 9, the standby current may flow as shown in the solid line 910. Thus, the standby current according to the example embodiments of the present invention may increase at a lower rate (during T2). When the reset signal VCCH transitions to the first voltage level, a resistance of the power-up reset circuit according to an example embodiment of the present invention may increase.

If the power voltage Vcc is maintained at a given level (during T3), the standby current may be held at a current level I2 (during T3). The current level I2 may be lower than the above-described current level I1.

In another example embodiment of the present invention, the standby current of the solid line 910 may be reduced at a lower rate as compared to the dotted line 905 (during T4) until the power voltage Vcc may be reduced to a level causing the reset signal VCCH to transition to the second voltage level (at the end of T4). If the reset signal VCCH transitions to the second voltage level, the standby current shown in the solid line 910 may reduce at a similar rate as compared to the dotted line 905 (during T5).

In another example embodiment of the present invention, the power-up reset circuits (e.g., power-up reset circuits 500/600/700) according to the example embodiments of the present invention may reduce power consumption in a semiconductor device by reducing the standby current (e.g., by the current margin between the current levels I1 and I2 of FIG. 9).

In another example embodiment of the present invention, a lower resistance may be included in a power-up reset circuit during a power-up operation as compared with a normal operation. Thus, the standby current and/or the power consumption associated with the power-up reset circuit may be reduced.

In another example embodiment of the present invention, a latch circuit may not be required in the power-up reset circuit 500/600/700. Thus, the problem of including an inappropriate value during the power-up operation which may trigger a false value for the reset signal VCCH may be avoided. Further, an additional circuit required by the conventional art to accommodate for this problem may not be required. Thus, the power consumption of the power-up reset circuit according to an example embodiment of the present invention may be further reduced since the additional circuit is not required.

The example embodiments of the present invention being thus described, it will be obvious that the same may be varied in many ways. For example, while the above-described example embodiments include references to the first and second voltage levels, in one example the first voltage level may refer to a high logic level and the second voltage level may refer to a low logic level. Alternatively, in another example, the first voltage level may refer to a low voltage level and the second voltage level may refer to a high voltage level.

Such variations are not to be regarded as departure from the spirit and scope of the example embodiments of the present invention, and all such modifications as would be obvious to one skilled in the art are intended to be included within the scope of the following claims.

What is claimed is:

1. A power-up reset circuit, comprising:
a detecting portion receiving a power voltage and outputting a node voltage, the node voltage being less than the power voltage;
an output portion outputting a detecting signal in response to the node voltage;
a first resistance adjuster including a first resistor and a first transistor, the first transistor being arranged in parallel with the first resistor and receiving a feedback voltage, the first transistor increasing a resistance of the first resistance adjuster based on the received feedback voltage during a normal operation, the increased resistance creating a divergence between a first threshold voltage and a second threshold voltage and reducing the node voltage during normal operation,
wherein the first resistance adjuster is coupled between the detecting portion and a ground voltage, and the power-up reset circuit outputs the feedback voltage of the power voltage level when the power voltage goes beyond the first threshold voltage during a power-up operation and outputs the feedback voltage of a low level when the power voltage goes below the second threshold voltage during the normal operation; and
a second resistance adjuster included within the output portion, the second resistance adjuster including a second resistor and a second transistor, the second transistor being arranged in parallel with the second resistor and receiving the feedback voltage, the second transistor increasing a resistance of the second resistance adjuster based on the received feedback voltage during normal operation, the increased resistance creating a divergence between a first threshold voltage and a second threshold voltage,
and wherein the output portion outputs the detecting signal depending on the resistance of the first resistance adjuster.

2. The power-up reset circuit of claim 1, wherein the first transistor is an NMOS transistor including a gate to which the inverted signal of the feedback voltage is applied.

3. The power-up reset circuit of claim 1, further comprising:
a signal generating portion outputting the feedback voltage in response to the detecting signal.

4. The power-up reset circuit of claim 1, wherein the first resistance adjuster reduces the node voltage during the normal operation.

5. The power-up reset circuit of claim 1, wherein the second transistor is a PMOS transistor including a gate to which the feedback voltage is applied.

6. The power-up reset circuit of claim 1, wherein the output portion includes a third resistor, and wherein the second resistance adjuster and the third resistor forming a pull-up.

7. The power-up reset circuit of 6, wherein the output portion includes a pull-down coupled between the pull-up and the ground voltage, the pull-down includes a third transistor including a gate to which the node voltage is applied.

8. The power-up reset circuit of claim 1, further comprising:
a signal generating portion outputting the feedback voltage in response to the detecting signal.

9. The power-up reset circuit of claim 8, wherein the signal generating portion includes at least one inverter.

10. The power-up reset circuit of claim 8, wherein the signal generating portion performs at least one of inverting and delaying the detecting signal to output the feedback voltage.

11. The power-up reset circuit of claim 3, wherein
the second resistance adjuster is coupled between the signal generating portion and the ground voltage, the increased resistance creating a divergence between the first threshold voltage and the second threshold voltage.

12. The power-up reset circuit of claim 11, further comprising:
a third resistance adjuster included within the output portion, the third resistance adjuster including a second resistor and a second transistor, the second transistor being arranged in parallel with the second resistor and receiving the feedback voltage, the second transistor increasing a resistance of the second resistance adjuster based on the received feedback voltage during normal operation, the increased resistance creating a divergence between a first threshold voltage and a second threshold voltage,
and wherein the output portion outputs the detecting signal depending on the resistance of the first resistance adjuster.

13. The power-up reset circuit of claim 11, wherein the second transistor is a NMOS transistor including a gate to which the inverted signal of the feedback voltage is applied.

14. The power-up reset circuit of claim 12, wherein the third transistor is a PMOS transistor including a gate to which the feedback voltage is applied.

15. A power-up reset circuit, comprising:
a detecting portion receiving a power voltage and outputting a node voltage, the node voltage being less than the power voltage;
an output portion outputting a detecting signal in response to the node voltage;
a signal generating portion outputting the feedback voltage in response to the detecting signal;
a first resistance adjuster including a first resistor and a first transistor, the first transistor being arranged in parallel with the first resistor and receiving a feedback voltage, the first transistor increasing a resistance of the first resistance adjuster based on the received feedback voltage during a normal operation, the increased resistance creating a divergence between a first threshold voltage and a second threshold voltage and reducing the node voltage during normal operation,
wherein the first resistance adjuster is coupled between the detecting portion and a ground voltage, and the power-up reset circuit outputs the feedback voltage of the power voltage level when the power voltage goes beyond the first threshold voltage during a power-up operation and outputs the feedback voltage of a low level when the power voltage goes below the second threshold voltage during the normal operation; and
a second resistance adjuster included within the output portion, the second resistance adjuster including a second resistor and a second transistor, the second transistor being arranged in parallel with the second resistor and receiving the feedback voltage, the second transistor increasing a resistance of the second resistance adjuster based on the received feedback voltage during normal operation, the increased resistance creating a divergence between a first threshold voltage and a second threshold voltage,
and wherein the output portion outputs the detecting signal depending on the resistance of the first resistance adjuster.

16. The power-up reset circuit of claim 15, wherein the first transistor is an NMOS transistor including a gate to which the inverted signal of the feedback voltage is applied.

17. The power-up reset circuit of claim 15, wherein the first resistance adjuster reduces the node voltage during the normal operation.

18. The power-up reset circuit of claim 15, wherein the second transistor is a PMOS transistor including a gate to which the feedback voltage is applied.

19. The power-up reset circuit of claim 15, wherein the output portion includes a third resistor, and wherein the second resistance adjuster and the third resistor forming a pull-up.

20. The power-up reset circuit of 19, wherein the output portion includes a pull-down coupled between the pull-up and the ground voltage, the pull-down includes a third transistor including a gate to which the node voltage is applied.

21. The power-up reset circuit of claim 15, further comprising:
a signal generating portion outputting the feedback voltage in response to the detecting signal.

22. The power-up reset circuit of claim 21, wherein the signal generating portion includes at least one inverter.

23. The power-up reset circuit of claim 21, wherein the signal generating portion performs at least one of inverting and delaying the detecting signal to output the feedback voltage.

24. The power-up reset circuit of claim 15, further comprising:
a third resistance adjuster included within the output portion, the third resistance adjuster including a second resistor and a second transistor, the second transistor being arranged in parallel with the second resistor and receiving the feedback voltage, the second transistor increasing a resistance of the second resistance adjuster based on the received feedback voltage during normal operation, the increased resistance creating a divergence between a first threshold voltage and a second threshold voltage,
and wherein the output portion outputs the detecting signal depending on the resistance of the first resistance adjuster.

25. The power-up reset circuit of claim 15, wherein the second transistor is a NMOS transistor including a gate to which the inverted signal of the feedback voltage is applied.

26. The power-up reset circuit of claim 24, wherein the third transistor is a PMOS transistor including a gate to which the feedback voltage is applied.

* * * * *